United States Patent
Marshall (10) Patent No.: US 7,893,723 B2
(45) Date of Patent: Feb. 22, 2011

(54) MINIMIZING LEAKAGE IN LOGIC DESIGNS

(75) Inventor: Andrew Marshall, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/967,129

(22) Filed: Dec. 29, 2007

(65) Prior Publication Data

US 2009/0167343 A1 Jul. 2, 2009

(51) Int. Cl.
*H03K 19/20* (2006.01)
*H03K 19/094* (2006.01)

(52) U.S. Cl. .................. 326/119; 326/17; 326/122; 327/544

(58) Field of Classification Search .................. 326/104, 326/112, 119, 151, 122
See application file for complete search history.

(56) References Cited

U.S. PATENT DOCUMENTS

| | | | |
|---|---|---|---|
| 6,078,195 A * | 6/2000 | Chen | 326/121 |
| 6,288,573 B1 * | 9/2001 | Tanizaki et al. | 326/120 |
| 6,496,040 B1 | 12/2002 | Narendra et al. | |
| 6,646,465 B2 * | 11/2003 | Bal | 326/40 |
| 7,107,566 B1 | 9/2006 | McElheny | |
| 7,295,036 B1 | 11/2007 | Zaveri et al. | |
| 7,298,175 B1 | 11/2007 | Rahman | |
| 2004/0130348 A1 * | 7/2004 | Yamaguchi | 326/81 |
| 2006/0028240 A1 | 2/2006 | Lui et al. | |

* cited by examiner

*Primary Examiner*—Rexford N Barnie
*Assistant Examiner*—Jany Tran
(74) *Attorney, Agent, or Firm*—John R. Pessetto; W. James Brady; Frederick J. Telecky, Jr.

(57) ABSTRACT

Devices and methods are disclosed for logic gate devices to provide reduced leakage while improving performance. The device is configured for low leakage logic application where high threshold voltage devices are used to reduce leakage at the expense of reduced logic speed. Better performance is achieved than a high threshold voltage stack.

3 Claims, 4 Drawing Sheets

MINIMIZING LEAKAGE IN LOGIC DESIGNS

FIELD OF THE INVENTION

The present invention relates generally to the field of integrated circuit processing, and more particularly to devices and methods for the manufacture of logic devices to improve leakage.

BACKGROUND OF THE INVENTION

For some years, there has been a demand in the semiconductor industry for system-on-chip devices. These devices incorporate multiple functions on a single chip. To achieve these functions, multiple transistor element types, each operated by a different power supply voltage, are mounted together. For example, some constructions include a peripheral region having I/O (Input/Output) device transistors that operate at a relatively high voltage, a step-down circuit to reduce the voltage, and a core region having logic device transistors that operate at a lower voltage.

Manufacturing reliable high-quality devices with high and low voltage transistors has proved challenging. High and low voltage transistors are formed with gate dielectrics having differing thicknesses and/or compositions. Processes that form gate dielectrics can have deleterious effects on previously formed gate dielectrics and their substrate interfaces. For example, growing a second gate dielectric can cause re-growth of a first gate oxide.

As semiconductor fabrication methods improve, it is becoming possible to fabricate transistors and other integrated circuit components with increasingly small dimensions. It is generally desirable to shrink component sizes as much as possible to reduce costs and improve performance. However, as transistor gates become smaller, they become less effective at turning transistors off. This can additionally lead to undesirable body leakage effects that increase the power consumption of an integrated circuit. Hardware-based approaches can help reduce body leakage and drain to source leakage. However, hardware-based approaches can result in an increase in circuit overhead and complexity. It would therefore be desirable to provide improved ways in which to reduce power consumption due to body leakage effects and source to drain leakage in programmable logic devices.

SUMMARY OF THE INVENTION

The following presents a simplified summary in order to provide a basic understanding of one or more aspects of the disclosure. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the disclosure is a logic device that comprises a plurality of P channel transistors coupled together in parallel and a transistor stack connected to P-channel transistors. The transistor stack comprises a plurality of N channel transistors coupled together in series, wherein at least one of the N channel transistors comprises a first threshold voltage and at least one of the N channel transistors comprises a second threshold voltage.

In another embodiment of the disclosure, a logic device comprises a plurality of transistors of a first type coupled together in parallel. The device further comprises a transistor stack connected to the plurality of transistors of the first type. The stack comprises a plurality of transistors of a second type coupled together in series, wherein at least one transistor of the second type comprises a low threshold voltage and at least one transistor of the second type comprises a high threshold voltage.

In yet another embodiment of the disclosure, a method for fabricating a programmable logic device to minimize power consumption due to gate leakage effects comprises forming at least one logic gate comprising a plurality of transistors connected together in series. The method of forming at least one logic gate of a plurality of transistors in series comprises forming a channel in at least one transistor with a first threshold voltage and forming a channel in a first one of the transistors in the stack with a second threshold voltage.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale. This disclosure relates to programmable logic devices, and more particularly to devices and methods for configuring programmable logic to minimize leakage current.

Figure 1:
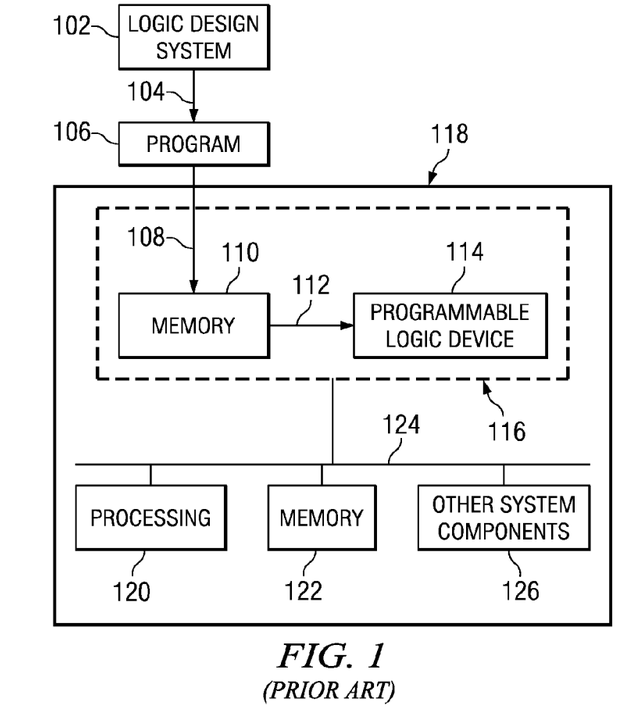
FIG. 1 illustrates a diagram of an illustrative system based on a programmable logic device in accordance with prior art.

An illustrative system environment for a programmable logic device 114 is shown in FIG. 1. Programmable logic device 114 may be mounted on a board 116 in a system 118. In general, programmable logic device 114 may receive programming data from programming equipment or from any other suitable equipment or device. In the example of FIG. 1, programmable logic device 114 is the type of programmable logic device that receives configuration data from an associated memory chip 110. With this type of arrangement, memory chip 110 may, if desired, be mounted on the same board 116 as programmable logic device 114. The memory 110 may be an EPROM chip or other non-volatile memory device. When system 118 boots up (or at another suitable time), the configuration data for configuring the programmable logic device may be supplied to programmable logic device 114 from memory 110 via path 112. The configuration data that is supplied to the programmable logic device may be stored in the programmable logic device in configuration data cells (memory).

System 118 may include processing circuits 120, storage 122, and other system components 126. The components of system 118 may be located on one or more boards such as board 116 or other suitable mounting structures or housings and may be interconnected by busses and other electrical paths 124. Memory 110 may be supplied with the configuration data for device 114 over a path such as path 108. Memory 110 may, for example, receive the configuration data from a program 106 (e.g., an EPROM programmer) or other suitable equipment that stores this data in device 110.

Logic designers therefore generally want to use logic design systems based on computer-aided-design (CAD) tools to assist them in designing circuits. A logic design system can help a logic designer design and test a complex circuit. When a design is complete, the logic design system may be used to generate configuration data for programming the appropriate programmable logic device.

As shown in FIG. 1 the configuration data produced by a logic design system 102 may be provided to program 106 over a path such as path 104. The program 106 can program the configuration data into memory 110, so that memory 110 can later provide this configuration data to the programmable logic device 114 over path 112. In arrangements of the type shown in FIG. 1, the programmable logic device 114 may have configuration data cells formed from memory cells such as static random-access memory cells. This is merely one illustrative arrangement for programming a programmable logic device 114. Any suitable arrangement for programming programmable logic device 114 may be used if desired. For example, programmable logic device 114 may be based on non-volatile configuration data cells such as erasable-programmable read-only memory (EPROM) cells. With this type of arrangement, device 114 can be configured by programming the configuration data into the EPROM cells on the device. Programmable logic device 114 may also be based on programmable elements such as fuses and antifuses or programmable elements based on other technologies (e.g., magnetic devices, etc.). Regardless of the particular approach used for programming programmable logic device 114, programmable logic device 114 can be configured using configuration data produced by a logic design system 102.

Logic design system 102 includes storage (not shown). Software is used to implement the functions of system 102. The software may be stored on a computer-readable medium (storage). The storage may include computer memory chips, removable and fixed media such as hard disk drives, flash memory, compact discs (CDs), DVDs, and floppy diskettes, tapes, or any other suitable memory or storage device(s). When the software of system 102 is installed, the storage may have instructions and data that cause the computing equipment in logic design system 102 to execute various methods (processes). When performing these processes, the computing equipment is configured to implement the functions of the logic design system 102.

The configuration data produced by the logic design system 102 determines which switches and logic gates are used in the circuitry of the configured programmable logic device 114. For example, the configuration data determines whether certain electrical pathways conduct electrical signals or form open circuits. During the configuration process, logic gates such as NAND, NOR, AND, and OR gates are configured with the configuration data. Both individual gates and gates that are formed as part of a logic array or other circuitry can be configured in this way. As an example, programmable logic device 114 may contain array logic such as AND-OR logic for forming a so-called sum of products. With this type of arrangement, a programmable AND array is used to implement a desired AND function on its inputs. The outputs of the AND array, which are called product terms, are combined (summed) using OR logic to form the sum-of-products.

Through the selective programming of the logic gates in logic arrays and other portions of the programmable logic device 114, a wide variety of complex logic circuit functions can be implemented. Because of the inherent flexibility of programmable logic devices, it is generally possible to implement a given logic function using many different logic configurations. For example, a data signal can often be routed from one portion of a programmable logic device to another using a multitude of different potential interconnect paths. As another example, there may be numerous similar regions of logic that are all capable of implementing a desired circuit, such as a counter, shift register, etc. There may, for example, be many identical look-up tables or macrocells on the programmable logic device, each of which is capable of implementing a particular desired circuit.

Although there may be many functionally-equivalent ways in which to program a given programmable logic device, some configurations are better than others. For example, it is generally desirable to use as few resources as possible on the programmable logic device. A logic design that uses 100 logic gates to implement a desired function will therefore generally be favored over a logic design that uses 2000 logic gates to achieve the same function. Similarly, it is generally considered a poor practice to use excessively long interconnect paths to route signals on a device, because this can lead to excessive propagation delays and undesirable circuit loading effects. A design that uses short and direct interconnect paths rather than lengthy and complex interconnect paths will generally have superior performance.

Another consideration is power consumption. With the approach of the present invention, it is possible to reduce power consumption due to overall leakage, especially that comprising body leakage and drain to source leakage effects by a given circuit design. Using the approach of the present invention, it is often possible to lower power consumption without adversely affecting performance in other respects. For example, power consumption can often be lowered without unduly affecting the amount of circuit resources that are consumed and without introducing significant additional routing delays. In some situations there may be no discernable penalty associated with the reduction in power consumption.

There are a number of factors that influence the overall power consumption of an integrated circuit. One portion of the power consumed by a programmable logic device arises from overall leakage effects in the metal-oxide-semiconductor (MOS) transistor structures that are typically used to form modern programmable logic device circuits. Overall leakage can consume power even when a transistor is in a relatively static state.

Figure 2A:
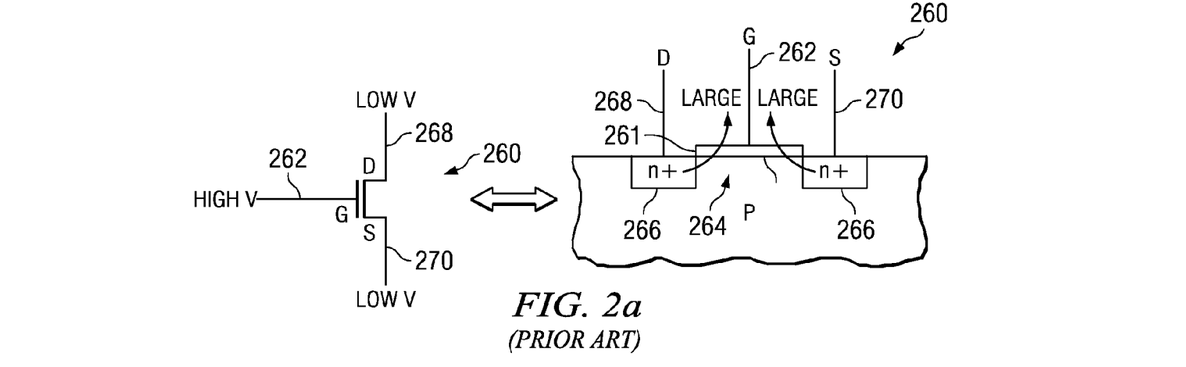
FIG. 2a illustrates a diagram showing gate leakage effects in a configuration in which a transistor has relatively high gate leakage.

FIG. 2a is an illustration of a transistor 260 of prior art that forms a logic gate in a programmable logic device 114. Transistor 260 of FIG. 2a has a gate terminal 262, a drain terminal 268, and a source terminal 270. The gate 262 of the transistor 260 has an associated gate oxide 261. The voltage across the gate oxide 261 depends on the voltages on the gate terminal 262 and source and drain terminals 268 and 270. When the voltage across gate oxide 261 is low, the leakage current though the gate oxide due to tunneling effects is low. When the voltage across gate oxide 261 is high, the leakage current through the gate oxide due to tunneling is high. High gate leakage currents lead to unwanted power dissipation. In addition, leakage effects due to the body leakage vary greatly with high threshold voltage transistors, as with power transistors compared to low threshold transistors, as with standard transistors. The present disclosure contemplates methods and devices for improving body leakage and drain to source leakage in a transistor stack.

During operation of transistor 260 of prior art, signals are applied to the gate 262 of the transistor. When a logic low signal (e.g., a low voltage of about $V_{SS}$) is applied to the gate, the transistor 260 is turned off and its power dissipation is relatively low. When a logic high signal (e.g., a high voltage of about $V_{DD}$) is applied to the gate, the transistor 260 is turned on. Depending on the voltages at the drain and source terminals, the power consumption of the transistor 260 due to gate leakage effects can be either high or low. In the illustrative situation shown in FIG. 2a, the gate leakage is high.

In the example of FIG. 2a, the voltage on the gate is high enough to reach the threshold voltage, the voltage on the source is low, and the voltage on the drain is low. As shown on the right-hand side of FIG. 2a, the low voltages on the drain terminal 268 and source terminal 270 are applied to the lower side 264 of gate oxide 261 via highly-doped n+ regions 266. The high voltage on the gate terminal 262 is applied to the upper side of the gate oxide 261 by the gate contact (not shown). Because the voltage on one side of the gate oxide is low while the voltage on the other side of the gate oxide is high, the voltage drop across the gate oxide 261 is high. Although the gate oxide (or other insulating gate layer) is formed from an insulating material, quantum-mechanical effects allow a non-negligible "tunneling" current to flow through the gate oxide 261. In the configuration of FIG. 2a, the voltage drop across the gate oxide 261 is high, so the tunneling current is relatively high.

Figure 2B:
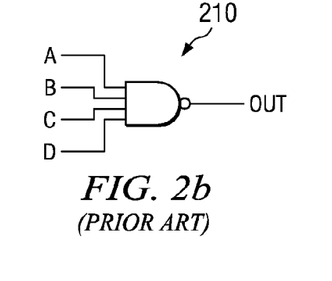
FIG. 2b illustrates a diagram of an exemplary NAND gate.

The logic symbol representation of NAND gate is shown in FIG. 2b. In the logic symbol representation of NAND gate of FIG. 2b, it appears as if each of the inputs associated with signals A, B, C, and D is the same. However, as will be made clear by the circuit diagram of FIG. 3, in an actual programmable logic device circuit implementation of gate 300, the circuit position of each transistor 308 is different. As a result of these differences, certain conditions, such as in a high threshold voltage device (i.e., a power transistors) are more likely to lead to high body leakage than others.

Figure 3:
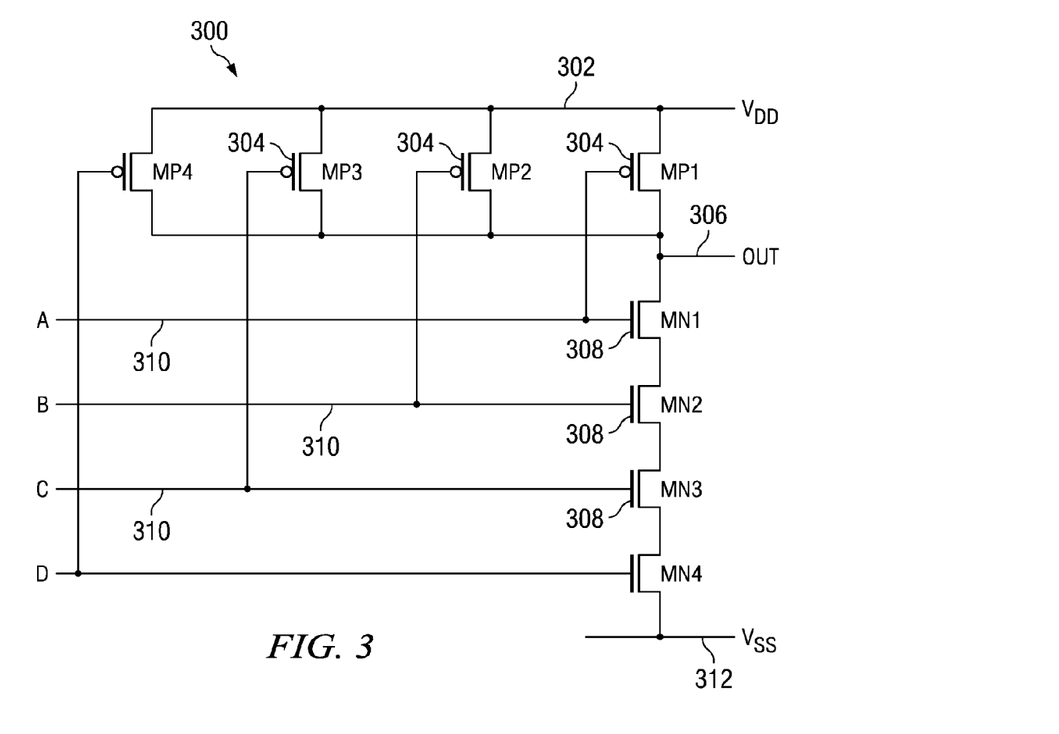
FIG. 3 demonstrates the drain leakage exhibited in typical MOS transistors.

The tendency of transistors to exhibit different amounts of leakage depending on their location in a logic circuit is called the "stacking effect." This effect (which occurs even if the transistors are not arranged exactly as shown in FIG. 3) arises because a transistor in one position in the stack (like transistor MN1 in the NAND gate example of FIG. 3) does not generally experience the same voltages as a transistor in another position in the stack (like transistor MN4 in the NAND gate example of FIG. 2b). Because gate leakage depends on the magnitude of the voltage applied across the transistor, the body leakage, and therefore the overall leakage power consumption of each transistor in the stack can vary depending on its position in the stack. The transistors in the stack of NAND gate 300 are NMOS transistors, but the same "stacking effect" occurs in logic gates such as NOR gates that have stacked PMOS transistors.

Prior art programmable logic libraries used the same threshold voltage (Vt) devices throughout the design. Various logic devices comprise low or standard Vt devices and others comprise high Vt devices, as in MOS power transistors. Prior art logic gate libraries utilize the same type of Vt device throughout the design, in particular within the same stack. Generally, high Vt devices are slower, but with lower leakage and low Vt devices are the opposite, wherein speed is increased, but leakage is greater. This comparison breaks down under some circumstances because of leakage to substrate conditions based on static logic. Generally, higher Vt devices are utilized to get higher Vt logic gates made of higher Vt transistors that give a lower leakage.

For example, it is common practice to use high Vt (HVT) transistors to reduce leakage in non-critical data paths of modern logic designs. The HVT transistor is typically designed for somewhat lower overall drain leakage compared to the standard Vt (SVT) equivalents. The table below illustrates various leakages demonstrated for an NMOS transistor, for example.

TABLE 1

NMOS leakage of the SVT transistor versus an HVT curve.

|  |  | Ig 0.04 | Ig 0.06 | Ig 0.08 | Ig 0.1 | Ig 0.14 | Ig 0.18 | Ig 0.22 |
| --- | --- | --- | --- | --- | --- | --- | --- | --- |
| nmos | n drain | 6.97E−07 | 3.05E−06 | 1.72E−08 | 1.69E−08 | 1.73E−08 | 1.92E−08 | 2.09E−08 |
|  | n gate | 6.65E−09 | 6.65E−09 | 6.65E−09 | 6.65E−09 | 6.65E−09 | 6.65E−09 | 5.65E−09 |
|  | n source | 6.89E−07 | 2.3E−08 | 9.78E−09 | 8.5E−09 | 8.83E−09 | 1.18E−08 | 1.34E−08 |
|  | n body | 1.59E−08 | 8.09E−10 | 7.96E−10 | 7.94E−10 | 7.94E−10 | 7.94E−10 | 7.93E−10 |
| nmos hvt | hn drain | 1.44E−07 | 1.29E−08 | 1.07E−08 | 1.05E−08 | 1.07E−08 | 1.09E−08 | 1.12E−08 |
|  | hn gate | 6.65E−09 | 6.65E−09 | 6.85E−09 | 6.65E−09 | 6.55E−09 | 6.65E−09 | 5.65E−09 |
|  | hn source | 1.35E−07 | 3.73E−09 | 1.5E−09 | 1.28E−09 | 1.46E−09 | 1.73E−09 | 1.97E−09 |
|  | hn body | 2.71E−09 | 2.56E−09 | 2.56E−09 | 2.65E−09 | 2.56E−09 | 2.55E−09 | 2.56E−09 |

From Table 1 it can be seen that NMOS leakage of the SVT curve is always higher than that of the HVT curve. The overall leakage current (Ig) amount for each of the terminals of the NMOS transistor is depicted in a corresponding row and under a corresponding column denoted by a given gate length. Typically, gate lengths are in the range of 0.1 microns to 3 microns.

For example, under the column of 0.08 gate length, NMOS HVT device demonstrates an overall drain leakage of 10.7 nA compared to SVT NMOS devices which demonstrate an overall drain leakage of 17.2 nA. This is about a 60% increase in overall drain leakage that is typically exhibited in SVT transistors. Similar trends are evident for PMOS devices. The NMOS leakage of a single NMOS represents the leakage state of an input-low inverter, or a low NOR gate.

Various differences exist for high Vt transistors, such as MOS power transistors as compared to low or standard Vt transistors. Standard MOS transistors typically are not suitable for high power applications. For example, an example of a MOS power transistor is a double diffused vertical MOS transistor (DMOS). The breakdown voltage can be very high (as high as 600V). This is because the depletion region between the substrate and the body extends mostly in the lightly doped substrate and does not spread into the channel. The result is a MOS transistor that simultaneously has a high current capability as well as a high break down voltage.

Referring now to FIG. 3, is an example of a NAND device where four NMOS devices 308 are coupled together in series to form a stack. The logic gate of FIG. 3 is a NAND gate 300, but this is merely illustrative. In general, programmable logic device has numerous logic gates of different types (NAND, AND, NOR, OR) and has many other circuit components. The NAND gate 300 of FIG. 3 is used as another example.

The NAND gate 300 has P channel MOS transistors 304 and N channel MOS transistors 308. The NAND gate 300 is powered by a power supply voltage V DD at terminal 302. A voltage $V_{SS}$ is supplied at terminal 312. Input signals A, B, C, and D are applied to terminals 310. If any of the inputs 310 is a logic low (e.g., a voltage of about $V_{SS}$), the N channel transistor 308 that is connected so that input will turn off, thereby allowing OUT terminal 306 to float, while the P channel transistor 304 that is connected to that input will turn on and pull the OUT terminal 306 to $V_{DD}$ (i.e., to a logic high). If all of the inputs are high, the N channel transistors 308 will all be on, while P channel transistors 304 will all be off. In this situation, OUT will be pulled to $V_{SS}$ (i.e., to a logic low). The NAND gate 300 therefore performs a NAND operation on the inputs 310 and produces a corresponding output signal OUT on terminal 306.

Because of the configuration of transistors MN1, MN2, MN3, and MN4 in the circuit representation of FIG. 3, these transistors are said to form a "stack." Transistor MN4 is farthest in the stack from the $V_{DD}$, as it appears at the bottom of the diagram, nearest to the ground voltage $V_{SS}$. Transistor MN1 is the highest in the stack, as it appears adjacent to the p-channel transistors 304, voltage supply 302, and output 306. Transistor MN2 is the second transistor in the stack that is lower than the highest transistor MN1 and higher than the third transistor MN3.

The tendency of transistors 308 to exhibit different amounts of leakage depending on their location in a logic circuit is called the "stacking effect." This effect (which occurs even if the transistors are not arranged exactly as shown in FIG. 3) arises because a transistor in one position in the stack (as with transistor MN1 in the NAND gate example of FIG. 3) does not generally experience the same voltages as a transistor in another position in the stack (as with transistor MN4). Because leakage depends on the magnitude of the voltage applied across the transistor, the body leakage, and therefore the overall leakage power consumption of each transistor in the stack can vary depending on its position in the stack. The transistors MN1, MN2, MN3, and MN4 in the stack of NAND gate 300 are NMOS transistors, but the same "stacking effect" occurs in logic gates such as NOR gates that have stacked PMOS transistors.

Referring now to Table 2 below is an example of leakage amounts for the stacked logic device of FIG. 3. The device has a stack of four NMOS devices coupled in series vertically. Trends are similar in all cases for other types of devices utilizing stacked gates as well, for example, NOR gates or transmission gates.

TABLE 2

Overall Leakage for 4 Stacked NMOS Devices.

| | | Ig 0.04 | Ig 0.06 | Ig 0.08 | Ig 0.1 | Ig 0.14 | Ig 0.18 | Ig 0.22 |
|---|---|---|---|---|---|---|---|---|
| n-stack | ns drain | 1.21E−08 | 8.33E−09 | 8.28E−09 | 8.52E−09 | 9.23E−09 | 9.89E−09 | 1.04E−08 |
| | ns gate | 6.75E−09 | 6.7E−09 | 6.68E−09 | 6.68E−09 | 6.67E−09 | 6.67E−09 | 6.67E−09 |
| | ns source | 4.58E−09 | 8.36E−10 | 7.99E−10 | 1.05E−09 | 1.76E−09 | 2.43E−09 | 2.95E−09 |
| | ns body | 8.03E−10 | 7.97E−10 | 7.95E−10 | 7.94E−10 | 7.94E−10 | 7.94E−10 | 7.94E−10 |
| n-stack hvt | hns drain | 1.02E−08 | 9.39E−09 | 9.36E−09 | 9.39E−09 | 9.49E−09 | 9.58E−09 | 9.65E−09 |
| | hns gate | 6.75E−09 | 6.89E−09 | 6.68E−09 | 6.67E−09 | 6.67E−09 | 6.67E−09 | 6.67E−09 |
| | hns source | 8.28E−10 | 1.25E−10 | 1.13E−10 | 1.48E−10 | 2.49E−10 | 3.44E−10 | 4.19E−10 |
| | hns body | 2.59E−09 | 2.57E−09 | 2.57E−09 | 2.57E−09 | 2.57E−09 | 2.57E−09 | 2.57E−09 |

To some extent the data in the Table 1 and Table 2 are consistent. The overall leakage in the HVT device alone in Table 1 is less and the devices together in the overall stack in Table 2 have a drain to source (D-S) leakage that is less also than the SVT devices. The D-S channel leakage at the source acts like a series resistance that is additive in property, therein causing a lower source leakage in the stack. The source leakage for n-stack HVT at 0.08 is 0.113 nA and for the standard SVT n-stack the source leakage is 6.68 nA. This is consistent with previous results. With four devices in series the D-S leakage or channel leakage encounters a higher resistance and therefore is lower than in the stand alone HVT device in Table 1. The channel resistance is additive and therein channel leakage or D-S leakage is lower for a stack of the devices. Consequently, the D-S leakage for the HVT stacked devices is lower than the D-S leakage for SVT devices in a stack.

Figure 4:
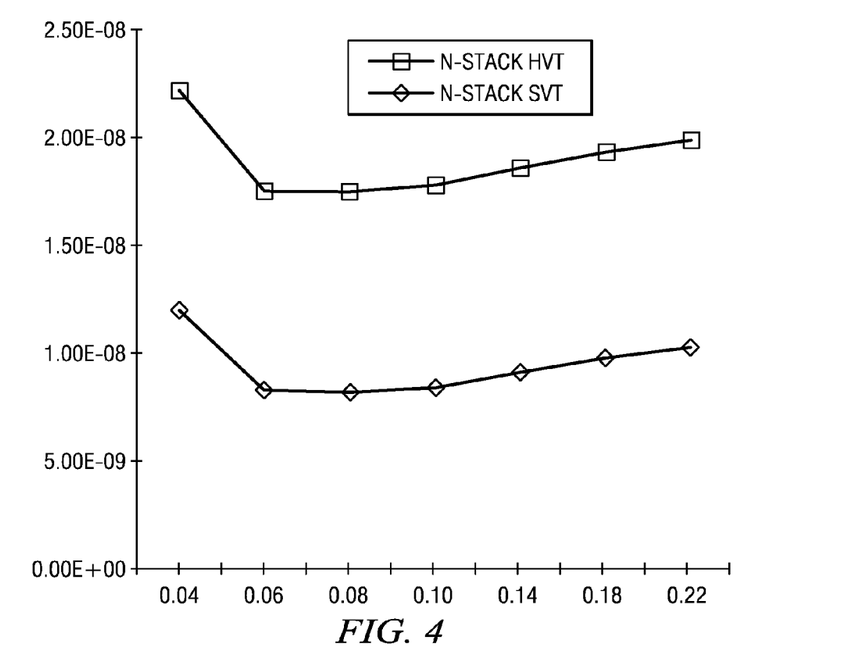
FIG. 4 illustrates the results of overall leakage exhibited from a stack of SVT NMOS devices compared to a stack of HVT NMOS devices.

Referring now to FIG. 4 illustrates the results of overall leakage exhibited from a stack comprising SVT NMOS devices compared to a stack comprising HVT NMOS devices. The top curve illustrates the overall drain leakage with regard to various channel lengths for NMOS HVT devices in a stack. The bottom curve represents the same for a stack of SVT devices. In the case of a stacked set of gates, as might be seen in a four input NAND device, as in FIG. 4 for example, the leakage is higher for all the HVT device stacks over much of the operating range than for an SVT stack. This would indicate that SVT devices would be better to use in these cases for stacked devices than HVT devices because the results are contrary to those obtained in Table 1.

Because the drain to source leakage is coupled in series in the stack, leakage for drain to source goes down a lot compared to an individual device illustrated in Table 1. However, the leakage down to the substrate or the body leakage is substantially due to the leakage from the drain of MN1 308 straight down to the Vss of FIG. 3. This is the same whether the stack comprises one transistor or several transistors. Therefore, the resistance to the channel leakage from drain to source is straight down the stack through MN1, MN2, MN3, MN4 and is additive in series. Therefore, a lower source leakage at $V_{SS}$ is demonstrated for HVT devices of a stack even though the results of FIG. 4 demonstrate that the overall leakage is not. For example, overall leakage of the stack for 0.08 gate length is approximately 8.3 nA for the SVT NMOS and for HVT the leakage is approximately 9.4 nA. Even so, the results of stacked devices are contrary to previous results in individual devices as illustrated by the HVT stack having a higher overall leakage than the regular/standard stack comprising the SVT devices.

The reason for these results is that the body leakage effect in a stack is discovered to become more prominent for the HVT devices. For example, unlike the results obtained from Table 1, the body leakage or leakage into the substrate of N-stack HVT is 2.57 nA at the 0.08 channel length column and is greater than for the N-stack SVT devices where the body leakage is now 0.795 nA. As a result the overall leakage seen at the drain is greater for the HVT device than for an SVT device or lower threshold voltage device. Consequently, an HVT logic gate could have a higher leakage than a regular standard threshold voltage device and it would be slower, thereby comprising the worst characteristics. This is likely due to the fact that there is a heavier doping in the channel to get a higher threshold voltage in the fabrication of HVT devices. Doping amounts are higher for HVT devices and it is more difficult to create the channel.

Figure 5:
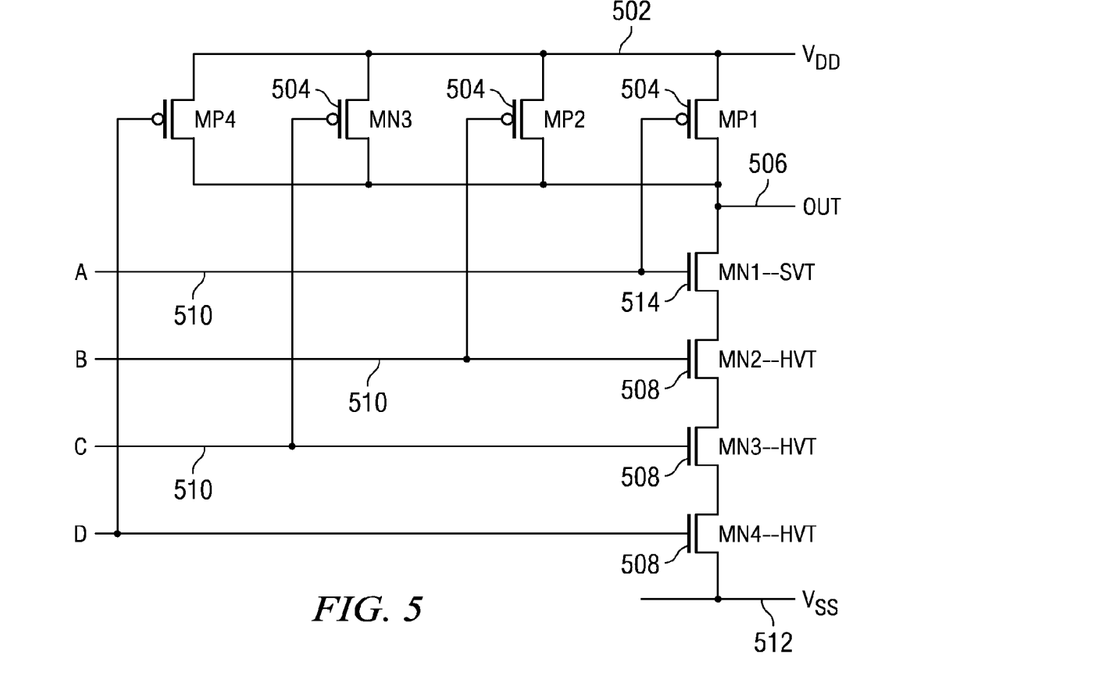
FIG. 5 illustrates a logic device of an embodiment of the present disclosure.

Referring now to FIG. 5 is an embodiment of the present invention wherein instead of obtaining a stack with HVT transistors that give the worst possible characteristics (i.e., slow speed and greater stack drain leakage), the best possible results are obtained by combining the better qualities of the SVT devices and HVT devices. FIG. 5 illustrates a logic device of an embodiment of the present disclosure. By making MN1 a regular Vt device a different result is achieved as demonstrated in Table 3 below.

tion or a transmission gate. In a NOR configuration the transistors 504 could be N MOS transistors and the transistors 508 and 514 could be P MOS transistors.

The NAND gate of FIG. 5 is powered by a power supply voltage $V_{DD}$ at terminal 502. A voltage $V_{SS}$ is supplied at terminal 512. Input signals A, B, C, and D are applied to terminals 510. If any of the inputs 510 is a logic low (e.g., a voltage of about $V_{SS}$), the N channel transistor 508 that is connected to that input will turn off, thereby allowing OUT terminal 506 to float, while the P channel transistor 504 that is connected to that input will turn on and pull the OUT terminal 506 to $V_{DD}$ (i.e., to a logic high). If all of the inputs are high, the N channel transistors 508 will all be on, while P channel transistors 504 will all be off. In this situation, OUT will be pulled to $V_{SS}$ (i.e., to a logic low). The NAND gate therefore performs a NAND operation on the inputs 510 and produces a corresponding output signal OUT on terminal 506. The N channel MOS transistors 508 are power transistors comprising a high threshold voltage and the N channel MOS transistor 514 is a standard device comprising a standard threshold voltage. The threshold voltages are at least two times greater for the HVT device than for the SVT device. The SVT MOS transistor 514 is located highest or closest to the P channel transistors coupled in parallel. The SVT MOS transistor 514 and HVT MOS transistors 508 are coupled together in series.

By combining HVT transistor devices 508 and SVT transistor devices 514 for the stack fabrication a better leakage is obtained. Further, placing the top device 514 closest to the P MOS transistors 504 coupled in parallel, a better leakage is obtained than otherwise. For example, under the 0.08 length column of Table 3 and row toptr SVT the overall leakage value is 7.64 nA. This is a less overall leakage than when the

TABLE 3

Overall Leakage for a Stacked Set of 4 NMOS Devices.

| | | Ig 0.04 | Ig 0.06 | Ig 0.08 | Ig 0.1 | Ig 0.14 | Ig 0.18 | Ig 0.22 |
|---|---|---|---|---|---|---|---|---|
| n-stack | ns drain | 1.21E−08 | 8.33E−09 | 8.28E−09 | 8.52E−09 | 9.23E−09 | 9.89E−09 | 1.04E−08 |
| n-stack hvt | hns drain | 1.02E−08 | 9.39E−09 | 9.36E−09 | 9.39E−09 | 9.49E−09 | 9.58E−09 | 9.65E−09 |
| toptr svt | rest hvt | 8.52E−09 | 7.67E−09 | 7.67E−09 | 7.68E−09 | 7.81E−09 | 7.93E−09 | 8.03E−09 |
| top2tr svt | rest hvt | 8.79E−09 | 7.74E−09 | 7.7E−09 | 7.76E−09 | 7.94E−09 | 8.11E−09 | 8.25E−09 |

The present example is illustrated as one embodiment of the disclosure that uses a NAND gate only for ease of explanation. Although other such devices that comprise a stack are contemplated as being within the scope of the invention. For example, a NOR gate may also be configured to comprise P channel MOS transistors coupled in series to form a device stack. In a NOR configuration the N MOS transistors would be coupled in parallel configuration while P MOS transistors comprise the stack in series. In addition, any "stacked" logic device may be implemented in the manner described below.

As a further example, transmission gates are also contemplated as comprising the device stack. In this example, the P MOS transistors or N MOS transistors comprising the stacked structure of the logic device may each be coupled in parallel to an additional P MOS transistor and/or N MOS transistor for purpose of transmission through the stack, as will be further explained below.

The NAND gate example of FIG. 5 has logic circuitry comprising P channel MOS transistors 504 coupled to N channel MOS transistors 508 and an N channel MOS transistor 514. This example of a logic device is illustrated in NAND configuration, however the device may be a NOR configurastack is fabricated with only SVT transistors or with only HVT transistors. Consequently, a reduced leakage of a stacked logic gate device is embodied while providing the same or better device performance. Relatively better performance is gained than an all HVT stack. In addition, other libraries could be found where the threshold voltages could be optimized so improved performance may be achieved without additional leakage.

Figure 6:
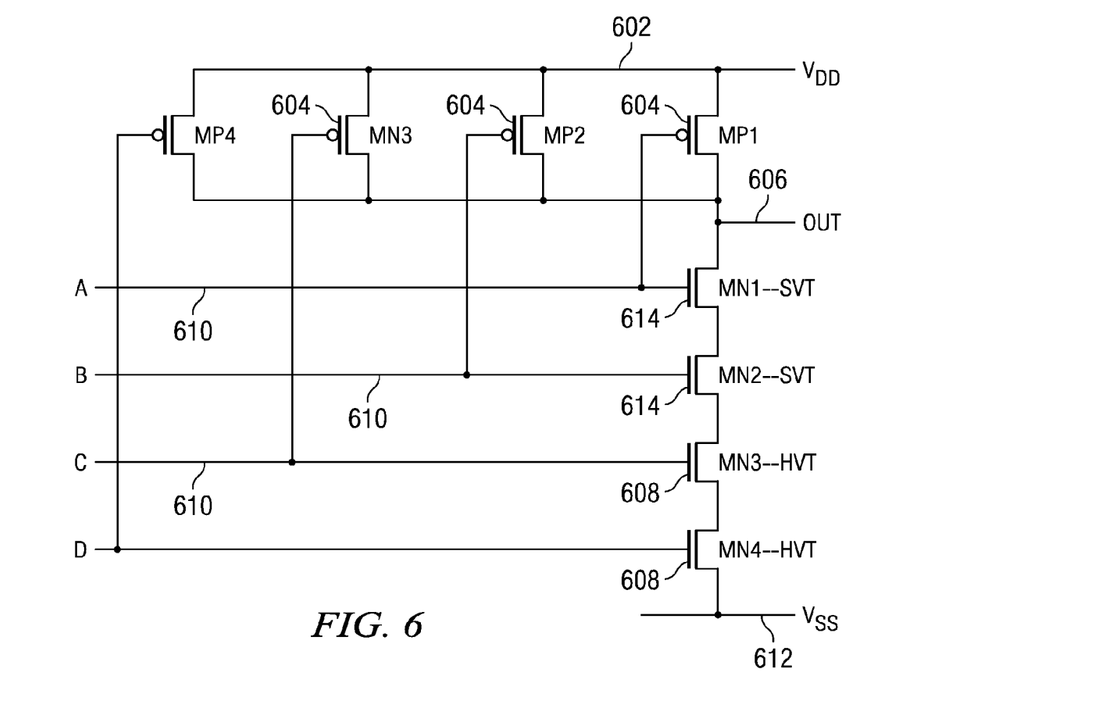
FIG. 6 illustrates a logic device of an embodiment of the present disclosure.

Referring now to FIG. 6, illustrates another embodiment of the present disclosure wherein a NAND gate comprises P channel MOS transistors 604 and N channel MOS transistors 608 and N channel MOS transistor 614. The P channel MOS transistors 604 are coupled together in parallel and configured to the N channel MOS transistors 608 connected in series. This illustrates an example of a NAND gate configuration embodying just one example of the present disclosure. However, just as equally the P channel MOS transistors can instead be N channel MOS transistor to comprise a NOR configuration. In addition, the transistors comprising the stack of the device, as shown by the series configuration of N channel MOS transistors 608 and 614, could just as easily be configured as transmission gates with either a complimentary P MOS transistor or N MOS transistor configured in parallel to the illustrated transistors in the stack to form a transmission device. All types of device stack could be implemented in the present invention and are contemplated as falling within the disclosure.

The NAND gate of FIG. 6 is powered by a power supply voltage V DD at terminal 602. A voltage $V_{SS}$ is supplied at terminal 612. Input signals A, B, C, and D are applied to terminals 610. If any of the inputs 310 is a logic low (e.g., a voltage of about $V_{SS}$), the N channel transistor 608 that is connected to that input will turn off, thereby allowing OUT terminal 606 to float, while the P channel transistor 604 that is connected to that input will turn on and pull the OUT terminal 606 to $V_{DD}$ (i.e., to a logic high). If all of the inputs are high, the N channel transistors 608 will all be on, while P channel transistors 604 will all be off. In this situation, OUT will be pulled to $V_{SS}$ (i.e., to a logic low). The NAND gate therefore performs a NAND operation on the inputs 610 and produces a corresponding output signal OUT on terminal 606. The N channel MOS transistors 608 are power transistors comprising a high threshold voltage and the N channel MOS transistor 614 is a standard device comprising a standard threshold voltage. The threshold voltages are at least two times greater for the HVT device than for the SVT device. The SVT MOS transistor 614 is located highest or closest to the P channel transistors coupled in parallel. The SVT MOS transistor 614 and HVT MOS transistors 608 are coupled together in series like the stack illustrated in FIG. 3.

By combining HVT transistor devices 608 and SVT transistor devices 614 for the stack fabrication a better leakage is obtained. The top or first SVT transistor device 614 is closest to the P MOS transistors 604 and higher in the stack. A second SVT transistor 614 is connected in series to the first. In this configuration a slightly worse leakage is obtained as illustrated in Table 4, but is still better than a uniform stack of all SVT transistors or all HVT transistors. For example, under the 0.08 length column of Table 3 and row toptr SVT the overall leakage value is 7.7 nA. This is a less overall leakage than when the stack is fabricated with only SVT transistors or with only HVT transistors. Consequently, a reduced leakage of a stacked logic gate device is embodied while providing the same or better device performance. Relatively better performance is gained than an all HVT transistor stack. In addition, libraries could be found where the threshold voltages could be optimized so improved performance may be achieved without additional leakage.

The advantage of having two SVT transistors at the top of the stack is that sometimes not all of the devices can be in the off state, as in the case for a NAND gate for example. Any particular input may be relatively higher than the others, and if the top NMOS is 'on' leakage through the second NMOS to substrate will be high. Therefore, instead of just having the top device as an SVT, the top two can be so configured. If all gates are off there is still SVT leakage down to $V_{SS}$, but now there are two Svt devices in series with two HVT devices for the drain source leakage. Transistors at top of the stack are the faster signal lines. Therefore, the device of FIG. 6 increases the overall leakage of the stack slightly by accounting for the leakages that could get in the substrate.

Figure 7:
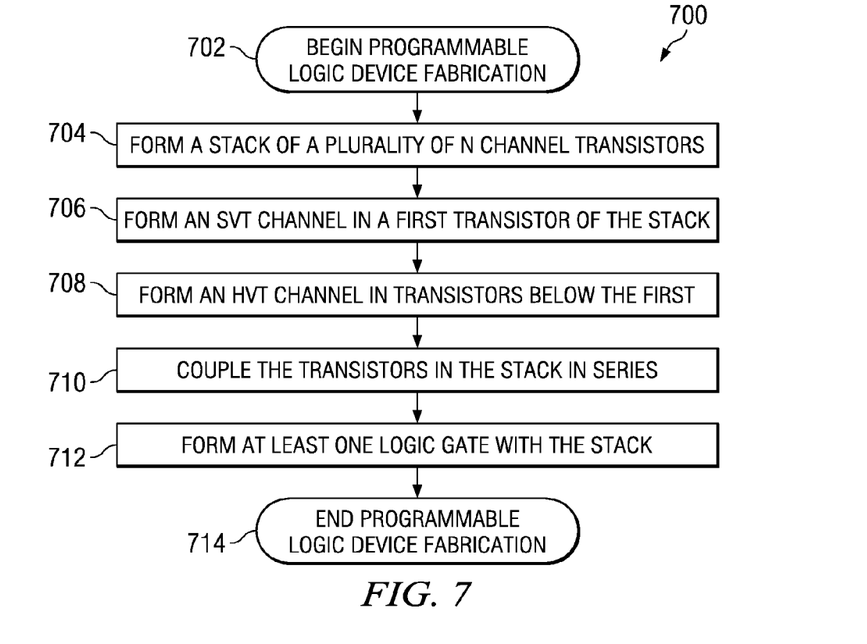
FIG. 7 illustrates a method of the present disclosure.

FIG. 7 illustrates a method of the present disclosure that begins at 702 with the fabrication of a programmable logic device. Programmable logic devices may be used in a number of system environments, an example of which was discussed above in FIG. 1. Further aspects of the invention relate to methods of fabricating logic devices, wherein FIG. 7 illustrates an exemplary method 700 in accordance with the invention. While the exemplary method 700 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of logic gates and composite transistors illustrated and described herein, as well as in association with other transistors and structures not illustrated, including but not limited to NMOS and/or PMOS composite transistors.

At 704 a stack is formed that comprises a plurality of N channel transistors. The tendency of transistors to exhibit different amounts of gate leakage depending on their location in a logic circuit is called the "stacking effect." This effect arises because a transistor in one position in the stack does not generally experience the same voltages as a transistor in another position in the stack. Because gate leakage depends on the magnitude of the voltage applied across the transistor's gate oxide, the gate leakage, and therefore the gate leakage power consumption of each transistor in the stack can vary depending on its position in the stack. The stacking effect occurs in any logic device that comprises a stack of transistors such a NAND or NOR device, for example.

At 706 an SVT channel is formed in a first transistor of the stack. The first transistor is the one closest to the supply drain of the device or the one at the top most location of the stack. In a NAND device it would be the position closest to the parallel configured transistors, for example. Prior art programmable logic devices used the same threshold voltage (Vt) devices throughout the stack. Various logic devices comprise low or standard Vt devices and others comprise high Vt devices. Generally, high Vt devices are slower, but with lower leakage and low Vt devices are the opposite, wherein speed is increased, but leakage is greater. This comparison breaks down under some circumstances because of leakage to substrate conditions based on static logic.

At 708 transistors are formed below the first transistor in the stack with a high voltage threshold. Generally, higher Vt devices are utilized to get higher Vt logic gates made of higher Vt transistors that give a lower leakage. At 710 the transistors that are HVT transistors and SVT transistors are coupled together in series in order to form a stack that is grounded at $V_{SS}$. At 712 the remainder of the logic gate is formed with the stack. This step and the others steps as mentioned above are not required to be in any specific order, but are only meant to depict an example of one sequence of events to describe the method in general. At 714 the fabrication process ends.

Figure 8:
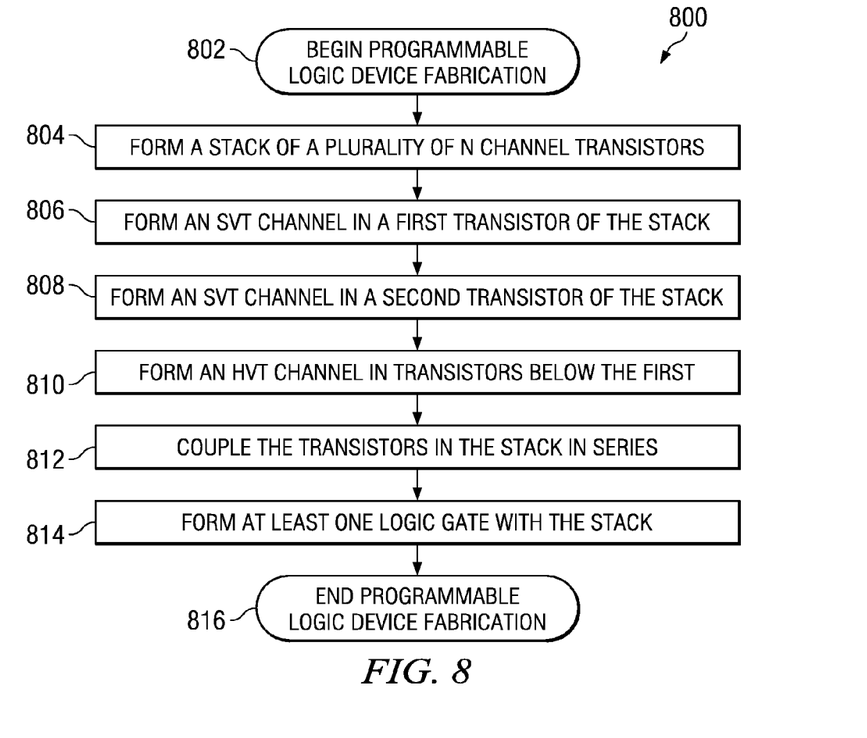
FIG. 8 illustrates another method of the present disclosure.

FIG. 8 illustrates another method of the present disclosure that begins at 802 with the fabrication of a programmable logic device. Programmable logic devices may be used in a number of system environments, an example of which was discussed above in FIG. 1. Further aspects of the invention relate to methods of fabricating logic devices, wherein FIG. 7 illustrates an exemplary method 800 in accordance with the invention. While the exemplary method 700 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of logic gates and composite transistors illustrated and described herein, as well as in association with other transistors and structures not illustrated, including but not limited to NMOS and/or PMOS composite transistors.

In general the method is similar to the one illustrated in FIG. 8. At 804 a stack is formed that comprises a plurality of N channel transistors. At 806 an SVT channel is formed in a first transistor of the stack. At 808 a second transistor of the stack is formed with as an SVT device or with a low voltage threshold, like in FIG. 7. The first transistor is the one closest to the supply drain of the device or the one at the top most location of the stack. In a NAND device it would be the position closest to the parallel configured transistors, for example.

At 810 at least one transistor is formed below the second transistor in the stack with a high voltage threshold. Generally, higher Vt devices are utilized to get higher Vt logic gates made of higher Vt transistors that give a lower leakage. At 812 the transistors that are HVT transistors and SVT transistors are coupled together in series in order to form a stack that is grounded at $V_{SS}$. At 814 the remainder of the logic gate is formed with the stack. This step and the others steps as mentioned above are not required to be in any specific order, but are only meant to depict an example of one sequence of events to describe the method in general. At 816 the fabrication process ends.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A logic gate device, comprising:
a plurality of input terminals;
an output terminal;
first and second voltage terminals;
a plurality of P channel MOS transistors wherein a source of each P channel MOS transistor in the plurality of P channel MOS transistors is directly connected to the first voltage terminal, wherein a drain of each P channel MOS transistor in the plurality of P channel MOS transistors is directly connected to the output terminal and wherein a gate of each P channel MOS transistor in the plurality of P channel MOS transistors is respectively coupled to different ones of the input terminals; and
a first N channel MOS transistor and a plurality of second N channel MOS transistors coupled together in a stack with source-drain paths in series between the second terminal and the output terminal, and with gates of the first and second N channel MOS transistors respectively coupled to different ones of the input terminals; with a drain of the first N channel MOS transistor directly connected to the output terminal;
wherein the second N channel MOS transistors are power transistors having high threshold voltages at least two times greater than the threshold voltage of the first N channel MOS transistor; and the first N channel MOS transistor is a standard transistor with a standard threshold voltage.

2. A NAND gate device, comprising:
a plurality of input terminals;
an output terminal;
first and second voltage terminals;
a plurality of P channel MOS transistors wherein a source of each P channel MOS transistor in the plurality of P channel MOS transistors is directly connected to the first voltage terminal, wherein a drain of each P channel MOS transistor in the plurality of P channel MOS transistors is directly connected to the output terminal and wherein a gate of each P channel MOS transistor in the plurality of P channel MOS transistors is respectively coupled to different ones of the input terminals; and
a first N channel MOS transistor and a plurality of second N channel MOS transistors coupled together in a stack, with source-drain paths in series between the output terminal and the second voltage terminal; and with gates of the first and second N channel MOS transistors respectively coupled to different ones of the input terminals;
with a drain of the first N channel MOS transistor directly connected to the output terminal; and
whereby when a logic low is applied to any one of the input terminals, the corresponding first or second N channel MOS transistor having its gate connected to that input terminal will turn off, while the corresponding P channel MOS transistor having its gate connected to that input terminal will turn on, thereby applying voltage from the first voltage terminal to the output terminal; and
whereby when a logic high is applied to all of the input terminals, the first and second MOS transistors will all turn on, while the P channel MOS transistors will all turn off, thereby applying voltage from the second voltage terminal to the output terminal;
wherein the second N channel MOS transistors are power transistors having high threshold voltages; and the first N channel MOS transistor is a standard transistor having a standard threshold voltage.

3. The NAND gate device of claim 2, wherein the high threshold voltages are at least two times greater than the standard threshold voltage.

* * * * *